(12) United States Patent
Suda

(10) Patent No.: US 6,893,941 B2
(45) Date of Patent: May 17, 2005

(54) SEMICONDUCTOR DEVICE AND ITS MANUFACTURE METHOD

(75) Inventor: Yasuo Suda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/630,680

(22) Filed: Jul. 31, 2003

(65) Prior Publication Data

US 2004/0023469 A1 Feb. 5, 2004

Related U.S. Application Data

(62) Division of application No. 10/099,960, filed on Mar. 19, 2002, now Pat. No. 6,635,941.

(30) Foreign Application Priority Data

Mar. 21, 2001 (JP) .................................... 2001-081000
Apr. 6, 2001 (JP) .................................... 2001-108726

(51) Int. Cl.$^7$ .............................................. H01L 21/30
(52) U.S. Cl. ...................... 438/455; 438/118; 438/67; 438/166; 438/487; 438/149; 438/97
(58) Field of Search ................................. 438/458, 118, 438/455, 67, 166, 487, 149, 97

(56) References Cited

U.S. PATENT DOCUMENTS

| | | | |
|---|---|---|---|
| 4,375,018 A | 2/1983 | Petersen | 200/5 A |
| 4,729,640 A | 3/1988 | Sakata | 350/348 |
| 4,732,599 A | 3/1988 | Bennion | 65/30.13 |
| 4,824,073 A | 4/1989 | Zdeblick | 251/11 |
| 4,911,968 A | 3/1990 | Higasihara et al. | 428/65 |
| 5,146,671 A | 9/1992 | Ogawa et al. | 29/603 |
| 5,340,978 A | 8/1994 | Rostoker et al. | 250/208 |
| 5,629,787 A | 5/1997 | Tsubota et al. | 349/153 |
| 5,677,749 A | 10/1997 | Tsubota et al. | 349/160 |
| 5,751,492 A | 5/1998 | Meyers | 359/619 |
| 5,886,971 A | 3/1999 | Feldman et al. | 369/112 |
| 5,981,945 A | 11/1999 | Spaeth et al. | 250/239 |
| 6,059,188 A * | 5/2000 | diFazio et al. | 235/462.36 |
| 6,122,009 A | 9/2000 | Ueda | 348/355 |
| 6,304,243 B1 | 10/2001 | Kondo et al. | 345/100 |
| 6,613,443 B2 * | 9/2003 | Komatsu et al. | 428/469 |
| 6,627,814 B1 * | 9/2003 | Stark | 174/52.3 |
| 2002/0062787 A1 | 5/2002 | Hashizume et al. | 118/664 |

FOREIGN PATENT DOCUMENTS

| | | |
|---|---|---|
| CN | 1135660 A | 11/1996 |
| EP | 1 067 779 | 1/2001 |
| JP | 9-27606 | 1/1997 |
| JP | 11-32169 | 2/1999 |
| JP | 11-121653 | 4/1999 |
| JP | 11-142611 | 5/1999 |
| JP | 11-345785 | 12/1999 |
| JP | 2000-61677 | 2/2000 |
| JP | 2001-78213 | 3/2001 |
| JP | 2001-78217 | 3/2001 |

* cited by examiner

*Primary Examiner*—Matthew Smith
*Assistant Examiner*—Igwe U. Anya
(74) *Attorney, Agent, or Firm*—Fitzpatrick, Cella, Harper and Scinto

(57) ABSTRACT

A semiconductor device formed by cutting a first substrate and a second substrate bonded together by a spacer, wherein: the spacer is disposed at an end of the first substrate after cutting; the second substrate is a semiconductor wafer formed with a light reception element or elements; and the first substrate has an optical element or an optical element set for converging light on the light reception element or elements. A method of manufacturing such a semiconductor device. A semiconductor device manufacture method includes: a step of detecting a warp of a semiconductor substrate; a step of holding the semiconductor substrate on a base under a condition that the warp is removed; a step of bonding an opposing substrate to the semiconductor substrate; and a step of cutting the opposing substrate, wherein the opposing substrate bonded to the semiconductor substrate is set with a size corresponding to the warp of the semiconductor substrate or with a gap to an adjacent opposing substrate.

9 Claims, 17 Drawing Sheets

SEMICONDUCTOR DEVICE AND ITS MANUFACTURE METHOD

This application is a division of application Ser. No. 10/099,960, filed Mar. 19, 2002, now U.S. Pat. No. 6,635,941.

BACKGROUND OF THE INVENTION

1. Field of the Invention

The present invention relates to a semiconductor device and its manufacture method, and more particularly to a semiconductor device having photoelectric conversion elements and its manufacture method.

2. Related Background Art

A conventional image pickup module has a semiconductor chip with light reception elements and a substrate having lenses for converging light on the light reception elements. The semiconductor chip and substrate are mounted on both sides of a spacer to be spaced apart by some distance. Light can be converged on a light reception plane of each light reception element so that a real image can be formed.

FIGS. 18A, 18B and 18C are broken perspective views illustrating a conventional image pickup module manufacture method. FIG. 18A shows a substrate 917 having lenses for converging light on a light reception element, FIG. 18B shows a spacer 901, and FIG. 18C shows a semiconductor chip 503 having light reception elements 100. According to a conventional image pickup module manufacture method, the substrate 917 and semiconductor chip 503 are bonded on both sides of the spacer 901 to form an image pickup module. If each of a plurality of image pickup modules is manufactured by this method, a number of manufacture processes are required including an alignment process for the semiconductor chip 503 and substrate 917.

FIGS. 19A, 19B and 19C are schematic cross sectional views illustrating another conventional image pickup module manufacture method.

FIG. 19A is a schematic cross sectional view of a semiconductor wafer 910 formed with a plurality of semiconductor chips, the wafer having some warp caused by a passivation film or the like formed by a semiconductor device manufacture process. This warp has a height difference of, for example, about 0.2 mm between the highest and lowest positions in the case of an 8-inch wafer. A wafer with a warp has a roll shape, a saddle shape, a bowl shape or the like.

As shown in FIG. 19B, the warp of the semiconductor wafer 910 is removed by sucking the bottom surface of the wafer 910 by using a jig 950.

Next, as shown in FIG. 19C, the semiconductor wafer 910 and a substrate 917 are bonded together via a spacer 901.

Thereafter, suction of the semiconductor wafer 910 is released to dismount the semiconductor wafer 910 and lens substrate 917 from the jig 950. This assembly of the semiconductor wafer and lens substrate is cut along each semiconductor chip and lens to form an image pickup module. A method of bonding together the semiconductor wafer 910 with semiconductor chips and the substrate 917 by a single alignment process is suitable for the manufacture of a plurality of image pickup modules.

(First Technical Issue)

After the semiconductor wafer 910 is bonded via the spacer 901 to the lens substrate 917 having a plurality of lenses for diverging light on light reception elements, each image pickup module is formed by dicing the substrate along each scribe line between semiconductor chips. During dicing, a force is applied to the substrate 917 from a dicing blade. This force may change the surface shape of a lens and hence a reflectivity thereof, degrading a focussing performance.

It is therefore an object of the invention to efficiently manufacture a semiconductor device such as an image pickup module without changing the surface shape of a lens during dicing.

(Second Technical Issue)

With the manufacture method illustrated in FIGS. 19A to 19C, after suction of the semiconductor wafer 910 is released, the semiconductor wafer 910 tends to recover the original warp state. If the lens substrate 917 is bonded to the semiconductor wafer 910 with a warp on the convex surface side, the semiconductor wafer 910 and lens substrate 917 are likely to be peeled off in the peripheral area of the semiconductor wafer 910.

Conversely, if the lens substrate 917 is bonded to the semiconductor wafer 910 with a warp on the concave surface side, the semiconductor wafer 910 and lens substrate 917 are likely to be peeled off in the central area of the semiconductor wafer 910.

If the semiconductor wafer 910 and lens substrate 917 are peeled off at the worst, or if an adhesive layer between the semiconductor wafer 910 and lens substrate 917 is elongated, the distance between the semiconductor wafer 910 and lens substrate 917 changes so that light cannot be converged correctly on the light reception element, disabling desired image pickup in some cases.

It is therefore another object of the invention to manufacture a semiconductor device such as an image pickup module capable of realizing reliable image pickup by considering a warp of a semiconductor substrate such as the semiconductor wafer 910.

SUMMARY OF THE INVENTION

According to one aspect of the invention, there is provided a semiconductor device formed by cutting a first substrate and a second substrate bonded together by a spacer, wherein: the spacer is disposed at an end of the first substrate after cutting; the second substrate is a semiconductor wafer formed with a light reception element or elements; and the first substrate has an optical element or an optical element set for converging light on the light reception element or elements.

According to another aspect of the present invention, there is provided a semiconductor device manufacture method comprising: a step of bonding a first substrate and a second substrate by using a spacer; and a step of cutting the first and second substrates, wherein the step of cutting the first substrate cuts the first substrate at a position where the spacer is disposed under the first substrate.

According to still another aspect of the present invention, there is provided a semiconductor device manufacture method comprising: a step of holding the semiconductor substrate on a base under a condition that the warp is removed; a step of bonding an opposing substrate to the semiconductor substrates with a size adjusted according to the warp of the semiconductor substrate; and then a step of cutting the opposing substrate.

DETAILED DESCRIPTION OF THE PREFERRED EMBODIMENTS

Embodiments of the invention will be described with reference to the accompanying drawings.

In the description of a semiconductor device of this invention, an image pickup module is used by way of example.

First Embodiment

Figure 1A:
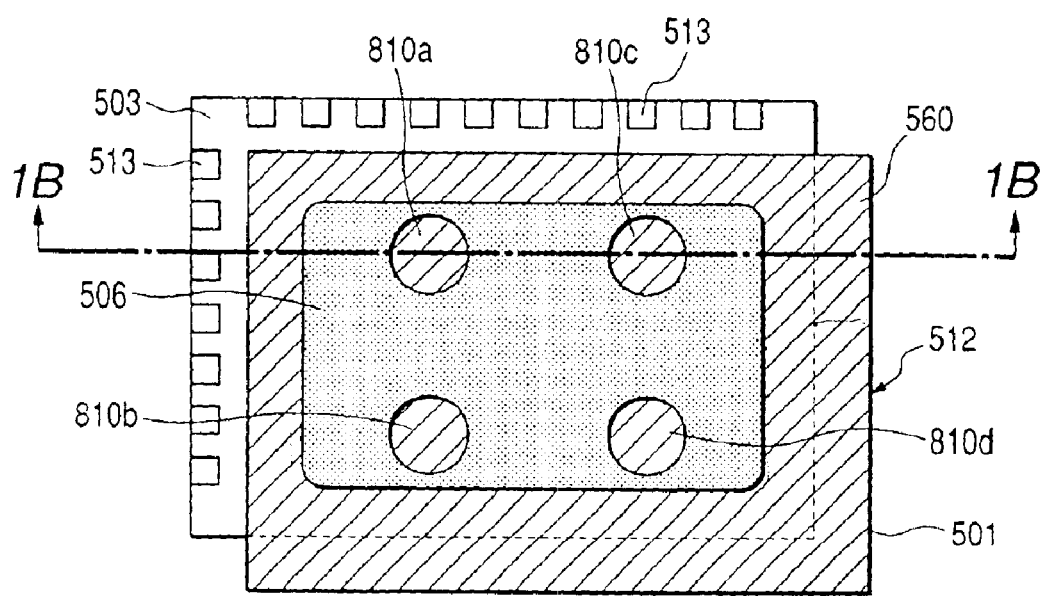
FIG. 1A is a schematic top view showing the structure of a semiconductor device according to a first embodiment of the invention.
Figure 1B:
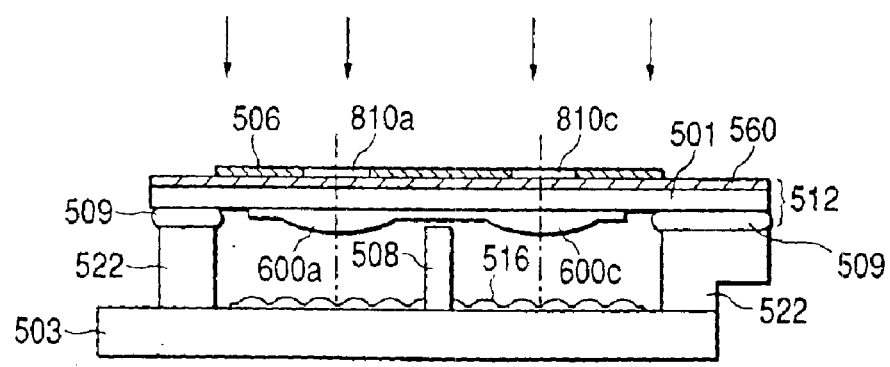
FIG. 1B is a schematic cross sectional view taken along line 1B—1B shown in FIG. 1A.
Figure 1C:
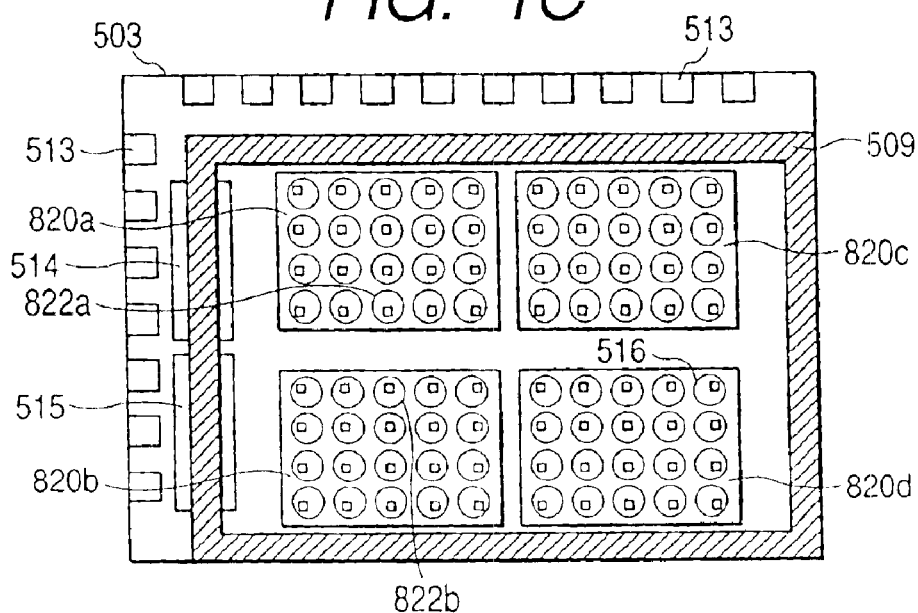
FIG. 1C is a top view of a semiconductor chip shown in FIG. 1A.
Figure 1D:
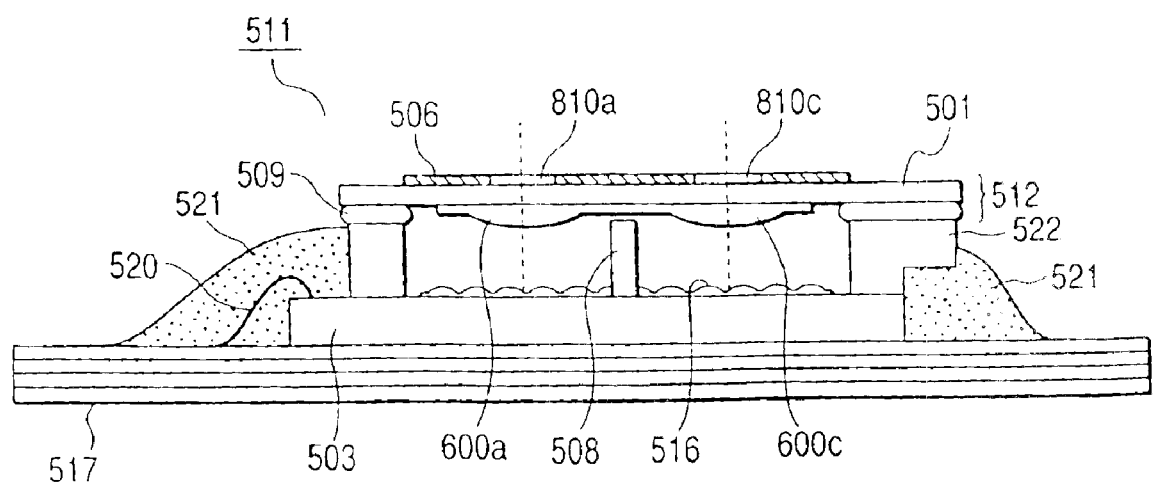
FIG. 1D is a schematic cross sectional view showing the semiconductor device of the first embodiment connected to an external electronic circuit.

FIG. 1A is a schematic top view showing the structure of a semiconductor device according to the first embodiment of the invention. FIG. 1B is a schematic cross sectional view taken along line 1B—1B shown in FIG. 1A. FIG. 1C is a top view of a semiconductor chip 503 shown in FIG. 1A. FIG. 1D is a schematic cross sectional view showing the semiconductor device of the first embodiment connected to an external electronic circuit.

Referring to FIGS. 1A to 1D, reference numeral 560 represents an infrared ray cut filter. Reference numeral 501 represents a light transmissive member constituting a first substrate after being cut. Reference numeral 506 represents a stop light shielding layer made of light shielding material, for example, offset printed on the infrared ray cut filter 560 on the light transmissive member 501. Reference numeral 512 represents a compound eye optical element having a compound eye lens constituted of the infrared ray cut filter, stop light shielding layer 506, and convex lenses 600a and 600c and unrepresented convex lenses 600b and 600d. In this embodiment, although the compound eye optical element having the compound eye lens constituted of four convex lenses is used, the number of lenses is not limited only to this, but it may be determined as desired. For example, an optical element having only one lens may be used. Reference symbols 810a, 810b, 810c and 810d represent stop apertures formed through the stop light shielding layer 506. It is preferable that the optical axes of the lenses 600a, 600b, 600c and 600d are disposed coaxially with the stop apertures 810a, 810b, 810c and 810d. The infrared ray cut filter 560 may be omitted. In this case, a thinner image pickup module can be formed. Reference numeral 503 represents a semiconductor chip as a second substrate after being cut, the semiconductor chip having pixels (not shown) including light reception elements disposed two-dimensionally. Reference numeral 522 represents a spacer which determines the distance between the compound eye optical element 512 and semiconductor chip 503. Reference numeral 509 represents an adhesive member for bonding the compound eye optical element 512 and semiconductor chip 503 via the spacer 522. Reference numeral 513 represents an electrode pad or external terminal for externally outputting a signal supplied from a light reception element such as a MOS type image pickup element or a CCD image pickup element or a light emitting element. Reference numeral 508 represents a light shielding member formed in spaces surrounded by the compound eye optical element 512, spacer 522 and semiconductor chip 503, the light shielding member preventing optical crosstalk between the four convex lenses. Reference numeral 516 represents a micro lens for increasing a light conversion efficiency of each light reception element. Reference symbols 820a, 820b, 820c and 820d represent light reception areas in which light reception elements are disposed two-dimensionally on the semiconductor chip 503. Reference numeral 514 represents an AD convertor for converting an output signal from each light reception element into a digital signal. Reference numeral 515 represents a timing generator for generating a timing signal for a photoelectric conversion operation of each light reception element. The spacer 522 may be made of any member which can determine the distance between the semiconductor chip 503 and compound eye optical element 512. For example, members having a predetermined length may be used, or adhesive mixed with beads may be used.

Reference numeral 517 represents a multi-layer printed circuit board to be used as an external electronic circuit substrate. Reference numeral 520 represents a bonding wire for electrically connecting the electrode pad 513 and an unrepresented electrode pad on the multi-layer printed circuit board 517. Reference numeral 521 represents thermosetting or ultraviolet ray hardening resin for sealing the peripheral area of the electrode pad 513 and bonding wire 520. In this embodiment, epoxy resin is used as thermosetting or ultraviolet ray hardening resin. Instead of electrical connection by the bonding wire 520, electrical connection by a TAB film may also be used. The ultraviolet ray hardening resin 520 is coated on the whole outer peripheral area of the image pickup module in order to obtain a mount stability of the image pickup module on the multi-layer printed circuit board. Reference symbols 822a and 822b represent light reception elements.

The image pickup module as the semiconductor device of the invention is characterized in that the spacer 522 is disposed at the peripheral sides of the compound eye optical element 512. Namely, the light permissive member 501 as the first substrate before being cut is bonded via the spacer 522 to the semiconductor wafer as the second substrate before being cut into semiconductor chips 503, and thereafter, the area where the spacer 522 exists under the light permissive member 501 is cut to form each image pickup module.

The spacer 522 is therefore disposed at the peripheral sides of the light transmissive member 501.

Figure 11:
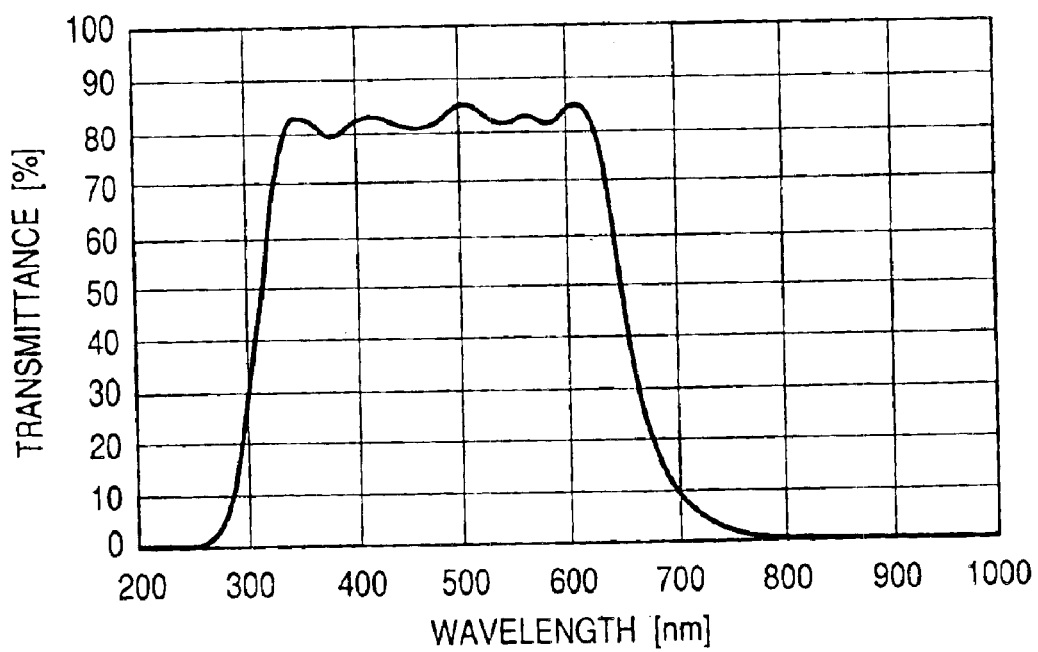
FIG. 11 is a graph showing the spectral transmittance characteristics of an infrared ray cut filter.

The more detailed description will be given for an image pickup module manufacture method of this embodiment. As shown in FIG. 11, the infrared ray cut filter 560 transmits 80% or more of electromagnetic waves (such as ultraviolet rays) having a wavelength in the range from 350 nm to 630 nm and hardly transmits electromagnetic waves (such as infrared rays) having a wavelength of 250 nm or shorter or 850 nm or longer.

The infrared ray cut filter 560 is formed on the whole surface of the light transmissive member 501 by vapor deposition or the like, and on this infrared ray cut filter 560 the stop light shielding layer 506 is formed. The stop light shielding layer 506 is disposed so as not to be superposed upon the adhesive member 509 along an ultraviolet ray incidence direction, so that ultraviolet ray hardening epoxy resin can be sufficiently hardened to form the adhesive member 509. The stop light shielding layer has an island outer shape. In this invention, the adhesive member 509 is not limited only to ultraviolet hardening epoxy resin so that the stop light shielding layer 506 and adhesive member 509 may be superposed upon each other along the ultraviolet ray incidence direction. In this specification, the ultraviolet ray incidence direction is a direction indicated by an arrow X.

The semiconductor chip 503 and spacer 522 are bonded by displacing one from the other because the bonded structure is suitable for electrically connecting the electrode pad 513 and an external electronic circuit by a wiring lead by bonding or the like. The semiconductor chip 503 and spacer 522 may be bonded not by displacing one from the other. In this case, the compound eye optical element 512 is preferably disposed not by displacing it from the spacer 522.

The semiconductor chip 503 will be described in more detail with reference to FIGS. 1B and 1C. As shown in FIG. 1B, between the compound eye optical element 512 and compound eye optical system 503, the spacer 522 made of resin, glass, silicon or the like is disposed in order to hold them at a predetermined distance. The spacer 522 and semiconductor chip 503 may be bonded together by utilizing a bonding process to be used when a silicon on insulator (SOI) substrate is formed. It is preferable to bond them together by using adhesive metal which contains aluminum or indium. The convex lenses 600a, 600b, 600c and 600d are formed on the light transmissive member 501 by a replica method, an injection molding method, a compression molding method or the like. The convex lens 600a–600d is a spherical surface Fresnel convex lens or a circular, axis-symmetrical, non-spherical surface Fresnel convex lens, respectively made of resin with which a curved image surface can be corrected more reliably as compared to a usual optical system using a continuous image surface.

The convex lenses 600a to 600d are bonded to the light transmissive member 501 by resin. A portion of resin is flowed in some cases to the peripheral area of each convex lens 600a–600d such as an area between the convex lenses 600a and 600c. If the flowed resin reaches the cut surface of the light transmissive member, a force may be applied to the resin during cutting along a direction of peeling off the resin from the light transmissive member 501. In such a case, the convex lenses 600a to 600d may have distortion. It is therefore preferable that the flowed resin does not reach the cut surface of the light transmissive member 501.

The position of each of the stop apertures 810a, 810b, 810c and 810d along the optical axis direction determines a main light beam outside the optical axis of the optical system. Therefore, the stop position is very important from the viewpoint of controlling various aberrations. Since each convex lens 600a–600d is formed on the image side, various optical aberrations can be corrected properly if the stop is positioned near at the center of a spherical surface approximating a Fresnel lens surface. If a color image is desired to be picked up, a green (G) transmissive filter, a red (R) transmissive filter and a blue (B) transmissive filter are disposed, for example, in a Bayer layout, near at each convex lens 600a–600d along the optical axis. If a particular color image or an X-ray image is desired to be picked up, the particular color filter or phosphor is disposed. In this embodiment, although not shown, a green (G) transmissive filter, a red (R) transmissive filter and a blue (B) transmissive filter are disposed in a Bayer layout.

The micro lenses 516 and light shielding member 508 are formed on the semiconductor chip 503. The micro lens 516 converges light on the light reception element in order to pick up an image of, for example, a subject with a low luminance. The light shielding member 508 prevents generation of optical crosstalk between light transmitted through the convex lens 600a and light transmitted through the convex lens 600c. The light shielding member is disposed between adjacent convex lenses.

If the light reception element 822a and other elements shown in FIG. 1C are CMOS sensors, it is easy to mount the A/D convertor 514 and the like on the semiconductor chip 503. If the A/D convertor 514 and the like and the adhesive member 509 are superposed upon each other on the semiconductor chip 503, the area of the semiconductor chip 503 can be reduced, resulting in a low cost.

The adhesive member 509 is preferably disposed spaced apart from the dicing line. In this case, it is possible to prevent the quality of the image pickup module from being lowered by the adhesive member 509 melted or broken into fine pieces or carbon particles by friction heat of the dicing blade and attached to the convex lenses 600a to 600d.

The micro lenses are disposed on the light reception areas 820a, 820b, 820c and 820d such that peripheral lenses such as 516 are shifted more toward the center of the line interconnecting the centers of the light reception areas.

FIG. 1D shows the multi-layer printed circuit board 517 as an external electric circuit board, bonding wires for electrically connecting the multi-layer printed circuit board 517 side and the electrode pads 513, and the thermosetting or ultraviolet hardening resin 521 for sealing the peripheral area of the electrode pad 513 and bonding wire 520.

Sealing by the adhesive member 509 and thermosetting or ultraviolet hardening resin 521 can reliably prevent deterioration of the micro lenses 216 and filter layers to be caused by entered dusts, moisture in the air and electrolytic corrosion of aluminum layers.

The thermosetting or ultraviolet ray hardening resin 521 is coated on the whole outer peripheral area of the image pickup module in order to establish the mount reliability of the image pickup module 511 on the multi-layer printed circuit board 517.

Since the electrode pad 113 and multi-layer printed circuit board 517 are connected by the bonding wire 520, an ITO film or via metal body is not necessary and the cost can be reduced correspondingly. In place of the bonding wire 520, a TAB film may be used.

Figure 2:
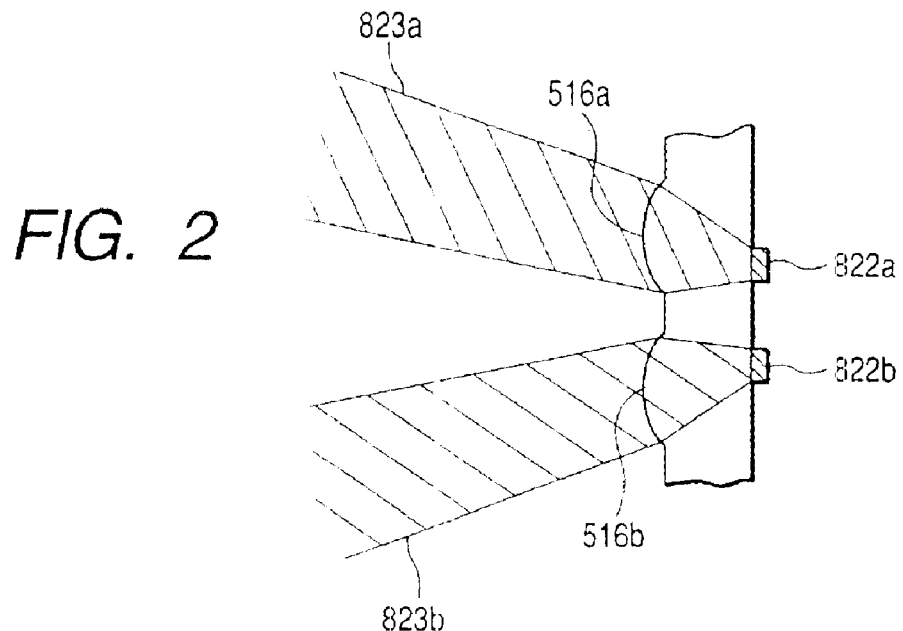
FIG. 2 is a schematic cross sectional view showing an area near light reception elements 822a and 822b shown in FIG. 1C.

FIG. 2 is an enlarged schematic cross sectional view showing an area near the light reception elements 822a and 822b shown in FIG. 1C. In FIG. 2, reference symbols 516a and 516b represent micro lenses formed above the light reception elements 822a and 822b, reference symbols 823a and 823b represent incident light fluxes passed through the stop apertures 810a and 810b. The micro lens 516a is upward eccentric relative to the light reception element 822a, whereas the micro lens 516b is downward eccentric relative to the light reception element 822b.

Only the light flux 823a is incident upon the light reception element 822a and only the light flux 823b is incident upon the light reception element 822b. The light fluxes 823a and 823b are inclined downward and upward relative to the light reception planes of the light reception elements 822a and 822b, and are directed toward the stop apertures 810a and 810b.

By properly selecting the eccentricity amounts of the micro lenses 516a and 516b, only a desired light flux becomes incident upon each light reception element 822. The eccentricity amounts can be set so that a subject light beam passed through the stop aperture 810a is received mainly in the light reception area 820a, a subject light beam passed through the stop aperture 810b is received mainly in the light reception area 820b, etc.

Figure 3:
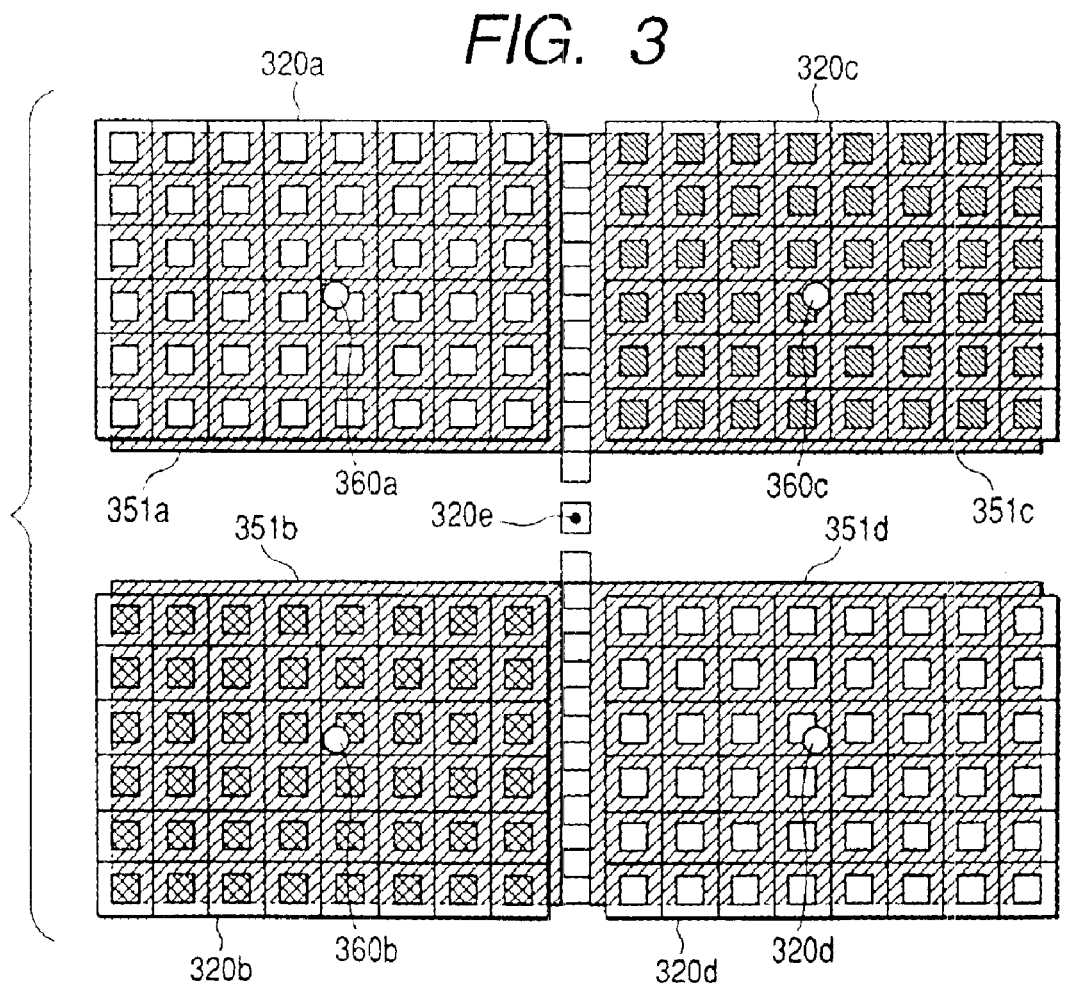
FIG. 3 is a diagram showing the positional relation between image pickup areas and the subject images picked up with a compound eye lens mounted on the image pickup module of the embodiment.
Figure 4:
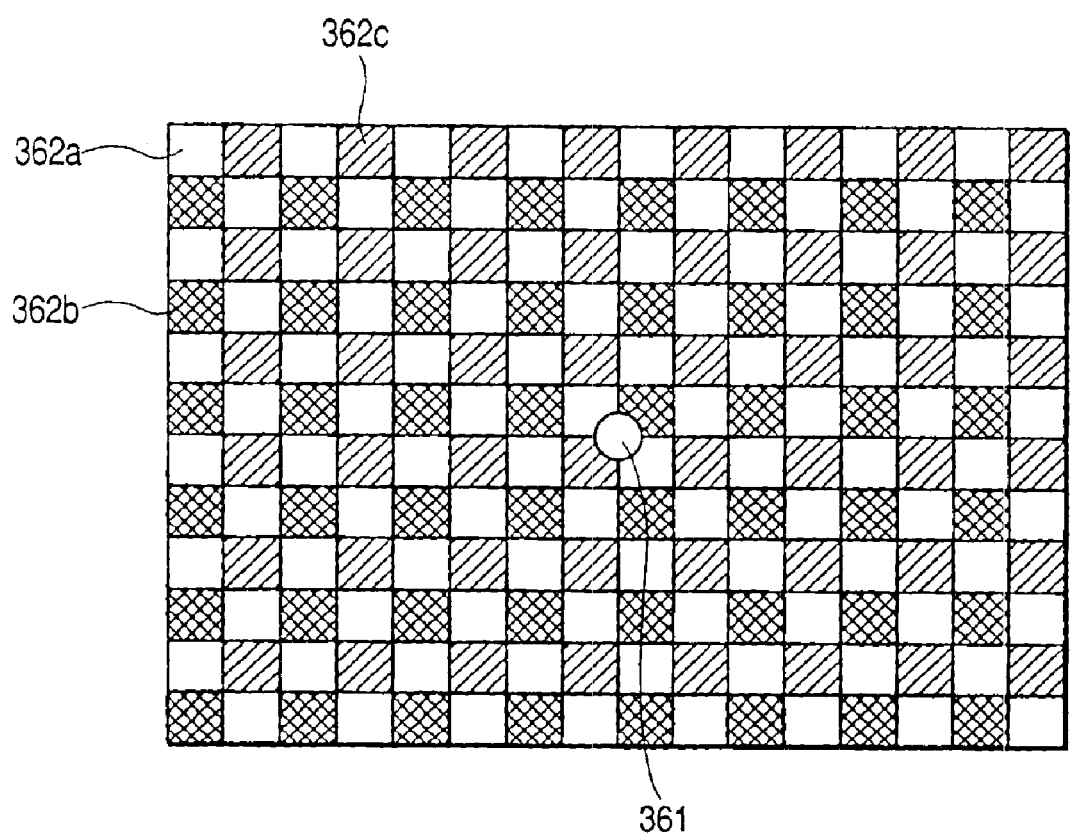
FIG. 4 is a diagram showing the positional relation between pixels when the image pickup areas shown in FIG. 3 are projected.

With reference to FIGS. 3 and 4, a mechanism of processing an electric signal converted in the light reception areas 820a to 820d of the image pickup module as a semiconductor device according to the first embodiment of the invention will be described. FIG. 3 is a diagram showing the positional relation between image pickup areas and the subject images picked up with the compound eye lens mounted on the image pickup module of the embodiment. FIG. 4 is a diagram showing the positional relation between pixels when the image pickup areas shown in FIG. 3 are projected. In FIG. 3, reference symbols 320a, 320b, 320c and 320d represent four light reception element arrays formed on the semiconductor chip 503. For the purposes of description simplicity, it is assumed that each of the light reception element arrays 320a, 320b, 320c and 320d has 8×6 pixels. The number of pixels is selected as desired and not limited only to the embodiment. The light reception element arrays 320a and 320d output G image signals, the light reception element array 320b outputs R image signals, and the light reception element array 320c outputs B image signals. Pixels in the light reception element arrays 320a and 320d are shown by a white square, pixels in the light reception element array 320b are shown by a hatched square, and pixels in the light reception element array 320c are shown by a black square.

Separation zones each having the size of one pixel in the horizontal direction and three pixels in the vertical direction are formed between adjacent light reception element arrays. Therefore, the center of a line connecting the centers of the light reception element arrays for outputting G image signals has the same vertical and horizontal positions. Reference symbols 351a, 351b, 351c and 351d represent subject images. Since pixels are disposed in a pixel shift layout, the centers 360a, 360b, 360c and 360d of the subject images 351a, 351b, 351c and 251d are offset from the centers of the light reception element arrays 320a, 320b, 320c and 320d by a quarter pixel distance toward the center 320e of all the light reception element arrays.

As the light reception element arrays are reversely projected on the plane at a predetermined distance on the subject side, a projection shown in FIG. 4 is obtained. Also on the subject side, reversely projected pixel images in the light reception element arrays 320a and 320d are shown by a white square 362a, reversely projected pixel images in the light reception element array 320b are shown by a hatched square 362b, and reversely projected pixel images in the light reception element array 320c are shown by a black square 362c.

Reversely projected images of the centers 360a, 360b, 360c and 360d of the subject images are superposed as one point 361, and each pixel image in the light reception element arrays 320a, 320b, 320c and 320d is reversely projected so as not to superpose the centers of respective pixels. Since the white square outputs a G image signal, the hatched square outputs an R signal and the black square outputs a B signal, the subject can be sampled by pixels in the manner similar to an image pickup device having color filters disposed in the Bayer layout.

As compared to an image pickup system using a single image pickup lens, the Bayer layout disposing R, G, B and G color filters for 2×2 pixels on the semiconductor chip 503 can form a subject image having a size of 1 divided by a root of 2, assuming that the pixel pitch is fixed. The focal length of the image taking lens is therefore shortened by 1 divided by a root of 2, i.e., by ½. This is considerably suitable for making a camera compact.

The operation of the image pickup module shown in FIGS. 1A to 1D will be described briefly. A subject light beam incident upon the optical element 512 passes through the stop apertures 810a to 810d and convex lenses 600a to 600d under the stop apertures and forms a plurality of subject images on the semiconductor chip 503. The images are converged via the micro lenses 516 on respective light reception elements.

Since the color filters are disposed, four subject images of R, G, B and G are formed on respective light reception elements which convert received light into electric signals.

Figure 5:
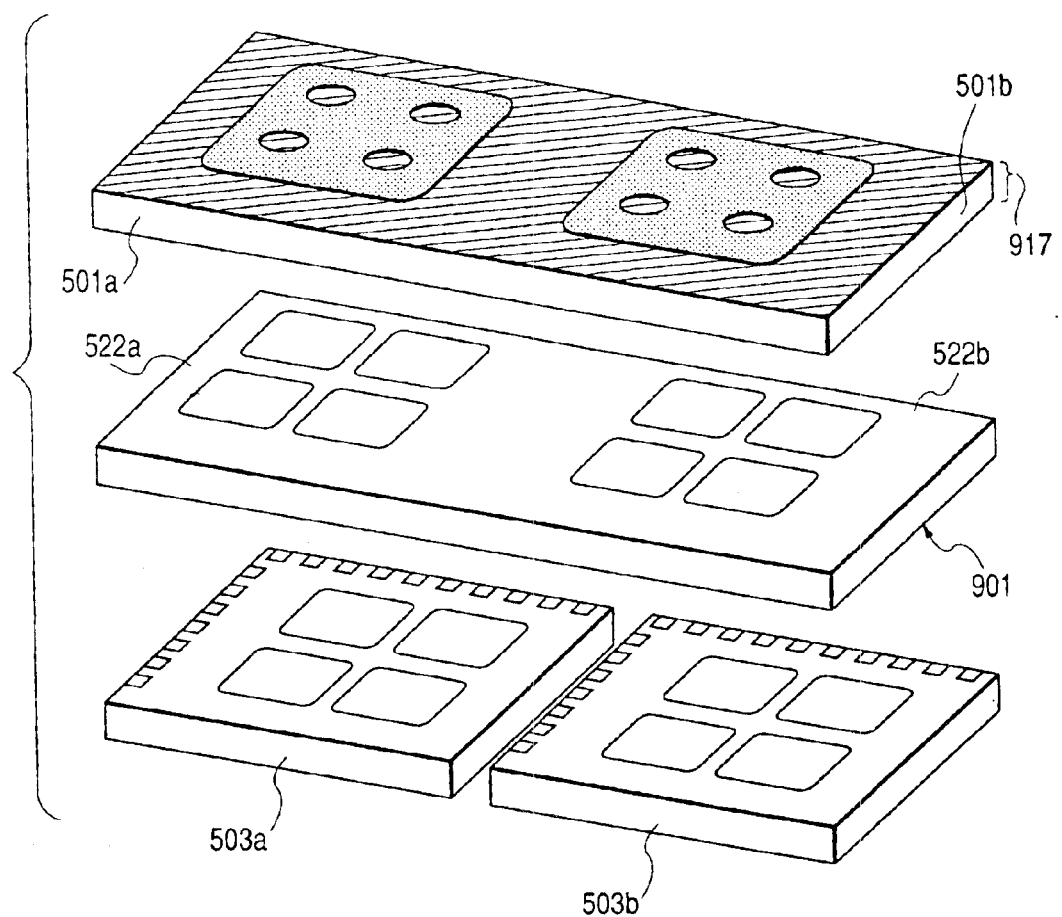
FIG. 5 is a broken perspective view illustrating a semiconductor manufacture method according to the invention.

A method of manufacturing an image pickup module as a semiconductor device according to the invention will be described in detail with reference to FIGS. 5 to 10. FIG. 5 is a broken perspective view illustrating the semiconductor manufacture method according to the first embodiment of the invention. Referring to FIG. 5, reference numeral 901 represents a spacer including spacers 522a and 522b, reference symbols 503a and 503b represent semiconductor chips, and reference numeral 917 represents an optical element set having light transmissive members 501a and 501b formed with lenses, light shielding layers, unrepresented color filters and the like. First, the optical element set 917 having the light transmissive members 501a and 501b formed with convex lenses 600a to 600d is bonded to the spacer 901. By dicing the area between the semiconductor chips 503a and 503b along a dicing line, an image pickup module with the semiconductor chip 503a and an image pickup module with the semiconductor chip 503b can be formed. A dicing area is an area where the space is formed under the light transmissive member 501 as the first substrate. A dicing line may be defined by a groove in the optical element set 917 formed by etching, metal marks formed through photolithography techniques, or resin projections formed by a replica. If the resin projections are formed by a replica at the same time when the convex lenses 600a to 600d are formed, the number of manufacture processes can be reduced.

Figure 6:
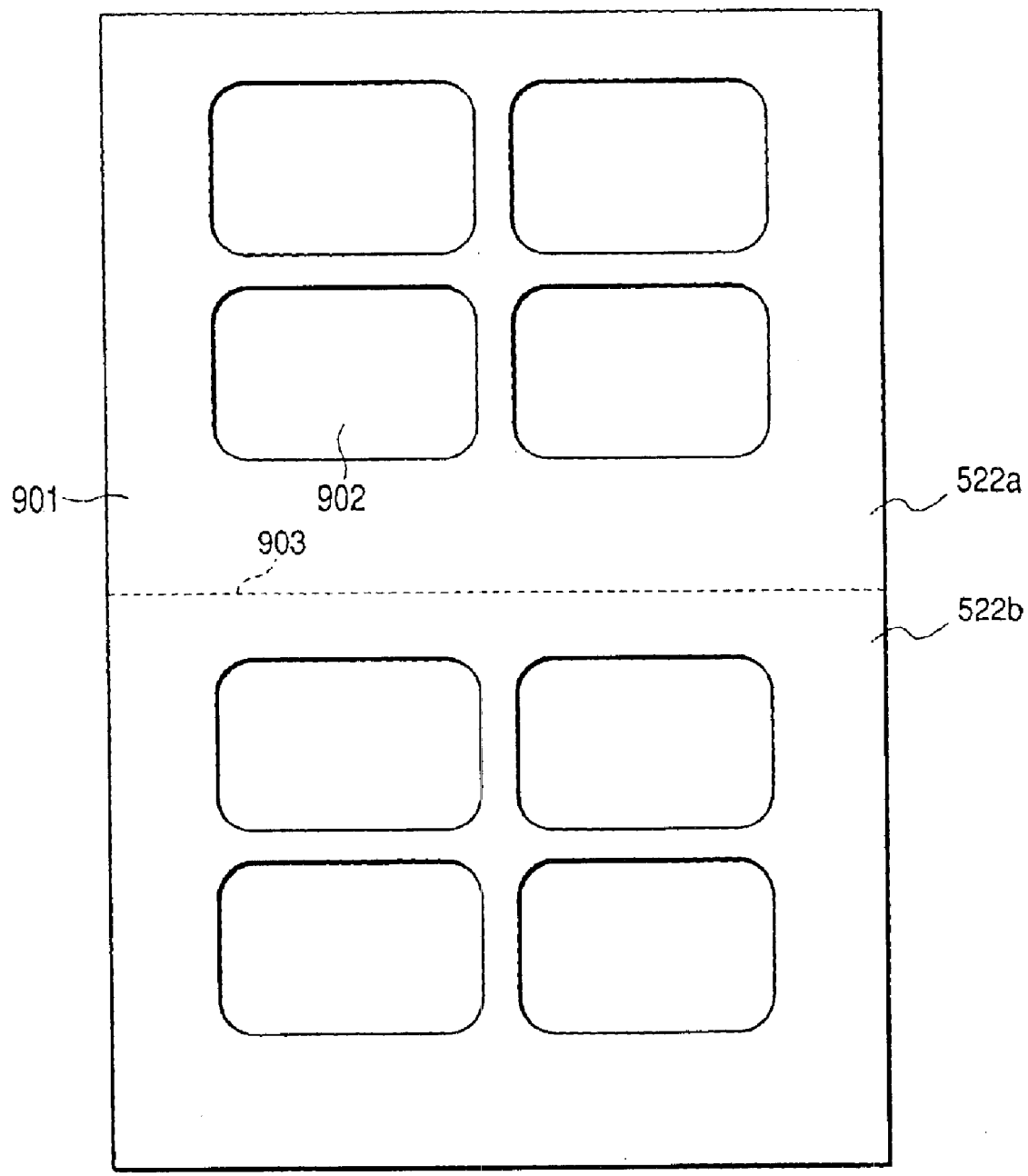
FIG. 6 is a top view of the spacer 901 shown in FIG. 5.

FIG. 6 is a top view of the spacer 901 shown in FIG. 5. The spacer 901 is separated by a division line 903 into the spacers 522a and 522b. The spacer 901 is formed with a plurality of openings 902 for guiding light fluxes passed through the convex lenses 600a to 600d to the light reception elements 822.

Figure 7:
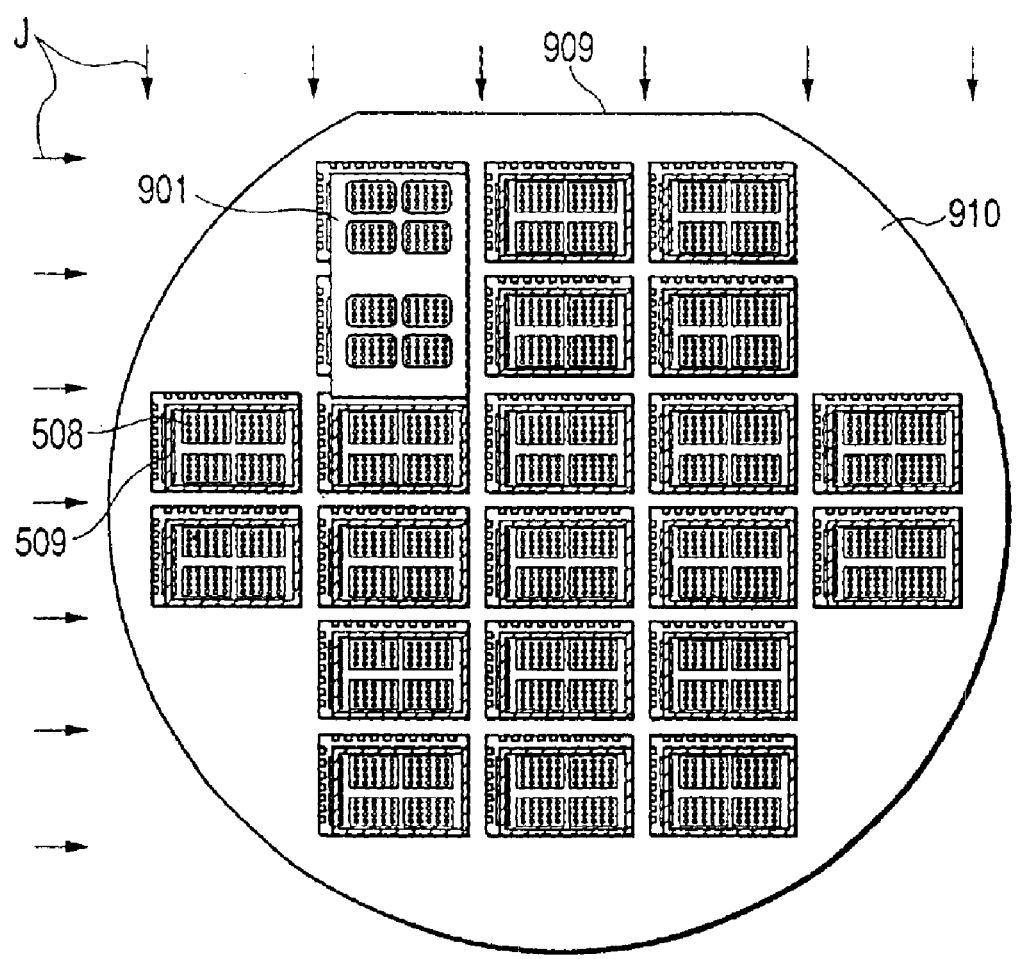
FIG. 7 is a top view of a semiconductor wafer 910 to which a spacer 901 is bonded.
Figure 8:
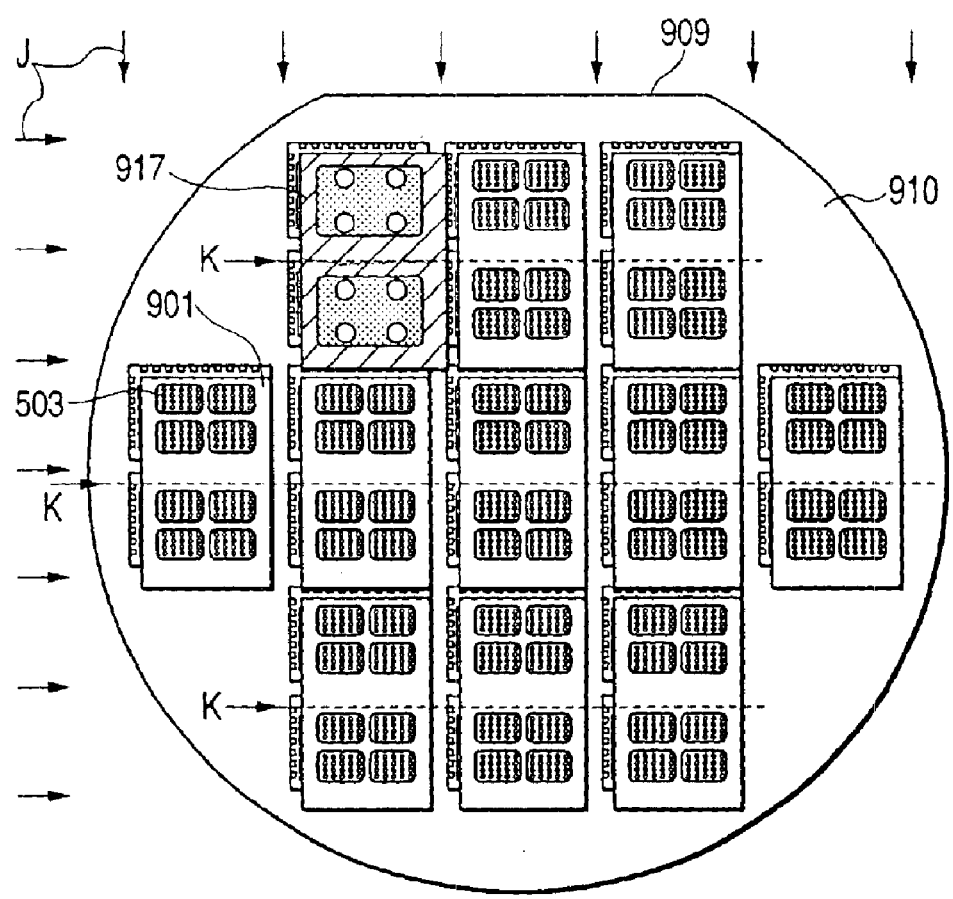
FIG. 8 is a top view of the semiconductor wafer 910 having the spacer 901 to which an optical element set 917 is bonded.
Figure 9:
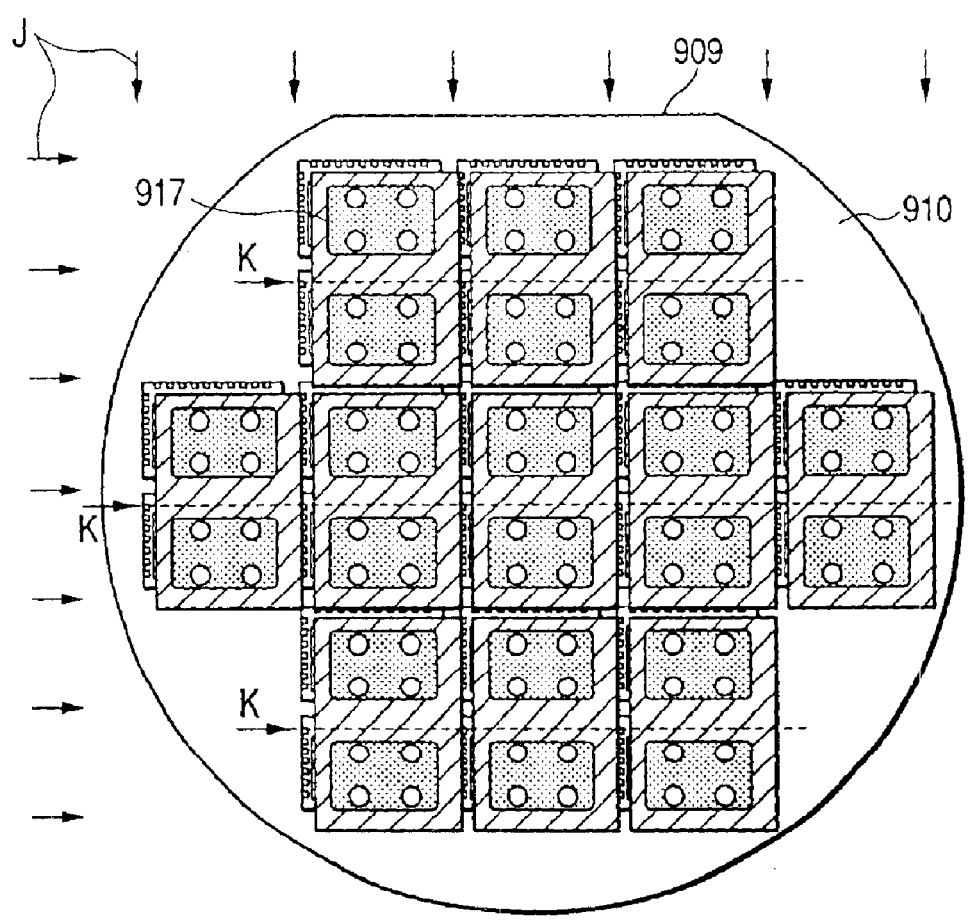
FIG. 9 is a top view of the semiconductor wafer 910 having the spacer 901 to which all optical element sets 917 are bonded.
Figure 10:
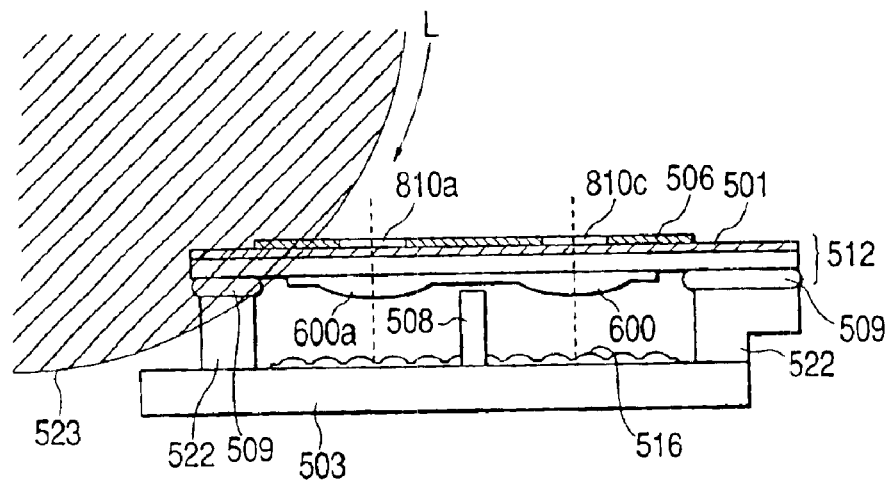
FIG. 10 is a schematic cross sectional view illustrating a dicing process to be executed after all optical element sets 917 are bonded.

FIGS. 7 to 10 are top views of a semiconductor wafer illustrating the processes of manufacturing semiconductor devices according to the embodiment. FIG. 7 is a top view of the semiconductor wafer 910 to which a spacer 901 is bonded. FIG. 8 is a top view of the semiconductor wafer 910 having the spacer 901 to which an optical element set 917 is bonded. FIG. 9 is a top view of the semiconductor wafer 910 having the spacers 901 to which all optical element sets 917 are bonded. FIG. 10 is a schematic cross sectional view illustrating a dicing process to be executed after all optical element sets 917 are bonded.

The semiconductor device manufacture method according to the invention will be described in detail. First, twenty two semiconductor chips 503 are formed on the semiconductor wafer 910 as the second substrate. Each semiconductor chip 503 has the structure shown in FIG. 1C. The number of semiconductor chips to be formed on the semiconductor wafer 910 is selected as desired.

Since the semiconductor wafer 910 may have some warp, the semiconductor wafer 910 is sucked when the optical element sets 917 are bonded, in order to remove the warp of the semiconductor wafer 910.

After the suction of the semiconductor wafer 910 is released later, a force is applied to the semiconductor wafer 910 to recover the original shape. This force may collide some optical element sets 917 with each other so that the distance between the semiconductor wafer 910 and the optical element sets 917 may be changed. In order not to change this distance, it is preferable to form some gap between adjacent semiconductor chips 503.

There is a strong tendency that the area of a semiconductor wafer is becoming large. When the optical element sets 917 are bonded to the semiconductor wafer 910 in a sucked state, some gap formed between adjacent semiconductor chips 503 helps to manufacture image pickup modules of good quality.

The spacer 901 is aligned with the two semiconductor chips 503 and bonded to an adhesive member 509 on the semiconductor chips 503. An arrow J indicates the position of a dicing line (FIG. 7).

The semiconductor wafer 910 made of crystal has electrical, optical, mechanical and chemical anisotropical characteristics. After the orientation of a pulled-up ingot is measured precisely by using X-ray diffraction, the ingot is sliced. Prior to slicing the ingot, a cylindrical ingot is formed with a straight portion called an orientation flat 909 which indicates the crystal orientation.

If a semiconductor element pattern of the semiconductor chip 503 is formed in alignment with the orientation flat 909, precise alignment between the optical element set 917 and the wafer can be established by using a reference pattern formed on the optical element set 917 and the orientation flat 909.

If the size of the optical element set 917 is set to the maximum size capable of being accommodated in the effective exposure size of a stepper, the number of image pickup modules manufactured from one wafer can be made large so that it is effective from the viewpoint of cost.

After the spacer 901 is bonded to the semiconductor chips 503, the optical element set 917 is bonded by using thermosetting or ultraviolet ray hardening epoxy resin in the state that the opening 902 of the spacer 901 is aligned with the corresponding convex lens 600. An arrow K indicates the position of the division line 903 of the optical element set 917 (FIGS. 6 and 8).

After the epoxy resin is semi-hardened by radiating ultraviolet rays, it is pressed until a predetermined gap is formed. Thereafter, the resin is completely hardened by a thermal treatment to fix the gap between the optical element set 917 and semiconductor wafer 910 so that a subject image can be focussed sharply on the light reception element array 912.

The adhesive member 509 is preferably disposed spaced apart from the division line 903 or dicing line. In this case, it is possible to prevent the quality of the image pickup module from being lowered by the epoxy resin melted or broken into fine pieces or carbon particles by friction heat of the dicing blade and attached to the convex lenses 600a to 600d.

The optical element set 917 is bonded to each spacer 901 in the similar manner (FIG. 9).

Epoxy resin is used because hardening is gentle and hardening contraction variation is rare so that stress can be relaxed. In this embodiment, although thermosetting resin can be used as the material of the adhesive member, it is more preferable to use ultraviolet ray hardening resin because heating sufficient for hardening the thermosetting resin may deteriorate the printed coat of the micro lens, replica, and stop light shielding layer 506 respectively formed on the semiconductor wafer 910.

The infrared ray cut filter 560 is formed in the peripheral area of the stop light shielding when the spectral transmittance of the infrared ray cut filter in this area is regulated to transmit ultraviolet rays, the epoxy resin can be hardened by ultraviolet ray radiation from a front of the semiconductor wafer 910.

If the optical element sets 917 are bonded and fixed before each semiconductor chip 503 is cut from the semiconductor wafer 910, the semiconductor wafer 910 and optical element sets 917 can be made parallel, i.e., the distance between the semiconductor wafer 910 and each optical element set can be made equal, more than if the optical element sets are not bonded and fixed before each semiconductor chip is cut. It is therefore possible that one-side unsharpness of an optical image is difficult to occur.

Lastly, the semiconductor wafer 910 is diced at the positions indicated by an arrow J, and the spacer 901 and optical element set 917 are cut at the position indicated by an arrow K. In dicing the semiconductor wafer 910, a cutting working system or a laser working system disclosed, for example, in Japanese Patent Application Laid-Open Nos. 11-345785 and 2000-061677 may be used.

As shown in FIG. 10, if a dicing blade is used, only the semiconductor wafer 910 is diced along the direction indicated by the arrow J from the bottom of the semiconductor wafer while cutting water is poured to cool the semiconductor wafer 910. In FIG. 10, reference numeral 523 represents a dicing blade.

Next, only the optical element set 917 and spacer 901 are cut from the top surface of the optical element set 917.

More specifically, as the dicing blade 523 rotates in the direction indicated by an arrow L, the dicing blade pushes in this direction the semiconductor wafer 910 before the semiconductor chips 503 are separated. If the resin layer coupled to the convex lenses 600*a*, 600*b*, 600*c* and 600*d* exists on the dicing line, a force is applied to the resin layer in the direction of peeling off the resin layer from the glass substrate of the compound eye optical element 512, and the surface precision of the convex lenses 600*a*, 600*b*, 600*c* and 600*d* may be degraded.

In this embodiment, since resin does not exist on the dicing line along which the dicing blade moves, a large force will not be applied to the convex lenses 600*a*, 600*b*, 600*c* and 600*d* so that the above problem can be solved. It is also possible to prevent the quality of the image pickup module from being lowered by the resin melted or broken into fine pieces or carbon particles by friction heat of the dicing blade 523 and attached to the convex lenses 600*a* to 600*d*.

With the above processes, the semiconductor wafer 910 and optical element set 917 are separated into rectangular pieces to obtain image pickup modules 511 shown in FIGS. 1A to 1D. With the cutting processes described above, triangular pieces or hexagonal pieces may also be formed.

The image pickup module 511 is connected to the multilayer printed circuit board 517 as shown in FIG. 1D.

In the above embodiment, two spacers are used for the spacer 901 and two compound eye optical elements are used as the optical element set 917. Three or four spacers and compound eye optical elements may also be used. In order to reduce the number of position alignment processes, the spacer 901 and the like may have the size similar to the semiconductor wafer 910, and the openings 902 and convex lenses 600 are formed at positions corresponding to each semiconductor chip 503 on the semiconductor wafer 910.

In this embodiment, although the image pickup module is used as an example of the semiconductor device, the embodiment may be applied to an image forming module having electron emitting elements formed on a semiconductor wafer 910 and light emitting elements such as phosphors formed on an opposing substrate, with a spacer 522 being interposed therebetween.

As described so far, according to the invention, a force is prevented from being applied to the first substrate 917 on the spacer during dicing. It is therefore possible to prevent the surface shape of a lens or the like formed on the first substrate from being changed. It is possible to provide a method of easily manufacturing a semiconductor device such as an image pickup module without changing the lens surface shape and without deterioration of a focussing performance.

Second Embodiment

FIGS. 12A to 12D are schematic diagrams illustrating semiconductor device manufacture processes according to a second embodiment of the invention. In FIGS. 12A to 12D, reference numeral 910 represents a semiconductor substrate with a warp such as a semiconductor wafer having a plurality of semiconductor chips formed thereon, reference numeral 950 represents a jig for sucking the semiconductor wafer 910 from its bottom surface to remove the warp of the semiconductor wafer, and reference numeral 917 represents optical element sets as an opposing substrate.

Figure 12A:
FIGS. 12A, 12B, 12C and 12D are schematic diagrams illustrating semiconductor device manufacture processes according to a second embodiment of the invention.

In FIGS. 12A to 12D, like elements represented by identical reference numerals to those of the first embodiment have been described earlier, and the description thereof is omitted. As shown in FIG. 12A, the semiconductor wafer 910 has some warp caused by a passivation film formed by a semiconductor device manufacture process. This warp has a height difference of about 0.2 mm between the highest and lowest positions in the case of an 8-inch wafer. A wafer with a warp has a roll shape, a saddle shape, a bowl shape or the like.

Figure 12B:
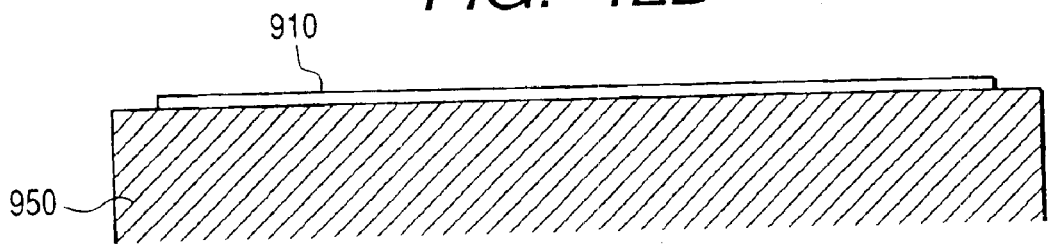
Figure 12C:
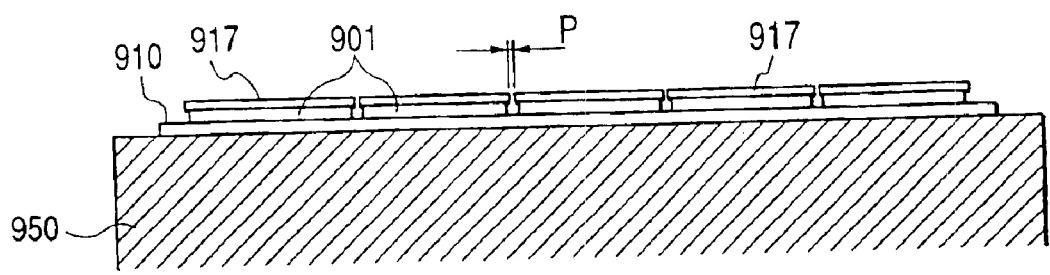

In order to prevent the generation of stress when the suction of the bottom surface of the semiconductor wafer 910 is released, it is necessary to adjust the number of optical elements in each optical element set. Namely, if the semiconductor wafer 910 has a warp whose convex and concave curves have a low frequency as small as about twice the diameter of the semiconductor wafer, the number of optical elements in each optical element set is made large to cover the semiconductor wafer 917 with a small number of optical element sets. If the semiconductor wafer 910 has a warp whose convex and concave curves correspond to about the diameter of the semiconductor wafer, the number of optical elements in each optical element set is made small to cover the semiconductor wafer 917 with a number of optical element sets. A gap P is preferably about 10 $\mu$m to 500 $\mu$m by considering a size variation of optical element sets. The frequency characteristics of the warp of the semiconductor wafer 910 can be obtained by frequency analysis of the surface shape. There is a general tendency that the larger the wafer size, the convex and concave curves have the smaller frequency. Therefore, the semiconductor wafer 910 is sucked from its bottom surface by using the jig 950 when optical element sets 917 are bonded to the semiconductor wafer 910, to thereby remove the warp of the semiconductor wafer 910 (FIG. 12B). More specifically, the semiconductor wafer 910 is sucked to the jig 950 by using an unrepresented sucking machine so that the whole bottom surface of the semiconductor wafer 910 becomes in contact with the jig. In this state, a plurality of spacers 901 are bonded to the semiconductor wafer 910, with the mount positions being aligned. Next, the optical element sets 917 are aligned in position with the optical element sets 917, and bonded thereto by using adhesive (FIG. 12C). After the adhesive is hardened, the suction is released.

The spacer 901 is disposed for bonding together the semiconductor wafer and optical element sets 917. This spacer may be omitted.

The size of an optical element set 917 are determined corresponding to the size of the warp of the semiconductor wafer 910. It is necessary that if the semiconductor wafer 910 has a larger warp, the spacer 901 and optical element set 917 are made smaller. The reason for this is as follows. When the suction of the semiconductor wafer 910 to the jig 950 is released, a force is generated to recover the original shape of the semiconductor wafer 910. This force makes adhesive have a creeping phenomenon. If the spacer 901 and optical element set 917 are made larger even if the convex warp is large, the distance of the optical element set 917 and semiconductor wafer 910 becomes longer from the semiconductor chip 503 nearer to the center of the semiconductor wafer 910. In this case, the focus point of the image pickup module is displaced from pixels.

Conversely, if the spacer 901 and the like is made larger, a balance between the compound eye optical element 512 and semiconductor chip 503 of each image pickup module can be obtained more easily and the number of position alignments is reduced. From these viewpoints, if a warp of a bowl shape has a height difference of about 0.2 mm between the highest and lowest positions in the case of an 8-inch wafer, and about six hundreds semiconductor chips 503 having a side length of about 6 mm are to be formed, the size of the spacer 901 and the like is set to the size of three semiconductor chips disposed in parallel to the side. FIGS. 12A to 12D show pluralities of an optical element sets 917, it also can be only one optical element 917 set on the semiconductor wafer 710.

Figure 12D:
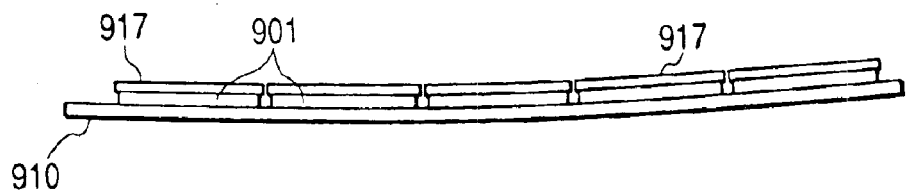

The gap P which is between a plurality of an optical element sets 917 is set with a size corresponding to the warp of the semiconductor substrate in order to prevent the distance between the semiconductor wafer 910 and optical element set 917 from being changed by the adhesive layer elongated or peeled-off by the creeping phenomenon of adhesive which occurs when a plurality of optical element sets 917 abut on each other when the suction of the semiconductor wafer 910 to the jig 950 is released (FIG. 12D). Since there is the tendency that semiconductor wafers are becoming large, when the optical element sets 917 are bonded to the semiconductor wafer 910 in a sucked state, some gap P formed between adjacent semiconductor chips helps to manufacture image pickup modules of good quality. The optical element such as shown in FIG. 1A and the optical element set 517 such as shown in FIG. 5 may be used. The optical element set 517 shown in FIG. 5 has two optical elements. The number of optical elements to be cut from the optical element set is determined as desired.

Figure 13:
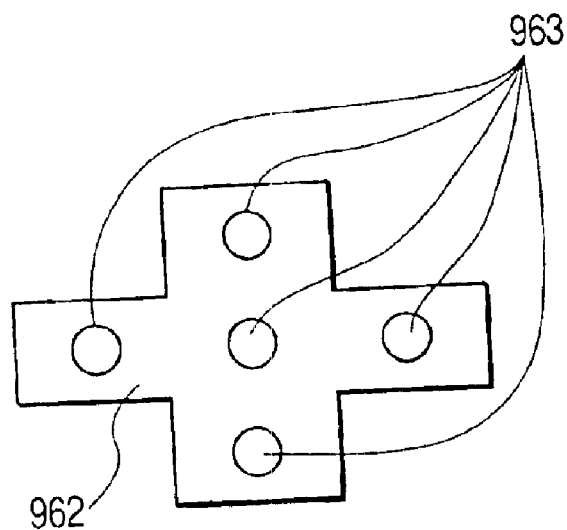
FIG. 13 is a schematic top view of an optical element set.
Figure 14:
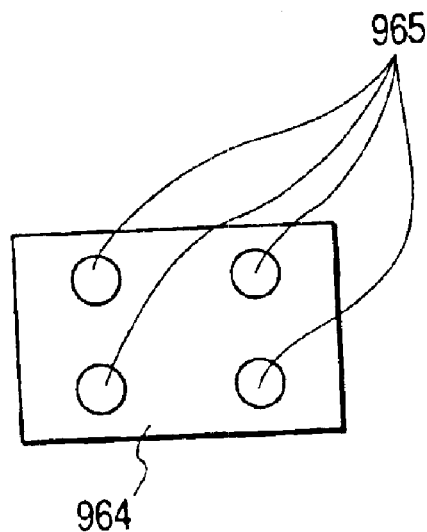
FIG. 14 is a schematic top view of an optical element set.

With reference to FIGS. 13 and 14, other examples of the optical element set will be described.

FIG. 13 is a schematic top view of an optical element set 962. In FIG. 13, reference numeral 963 represents a lens. The optical element set 962 has a cross shape. By using this optical element set 962, five image pickup modules each having one lens can be manufactured. The pitch of lenses 963 is the same as that of semiconductor chips on an unrepresented semiconductor wafer 910 so that each image pickup module has the lens of the optical element set 962 bonded to the semiconductor wafer 910.

FIG. 14 is a schematic top view of an optical element set 964. In FIG. 14, reference numeral 965 represents a lens. The optical element set 964 has a rectangular shape. By using this optical element set 964, four image pickup modules each having one lens can be manufactured. The pitch of lenses 965 is the same as that of semiconductor chips on an unrepresented semiconductor wafer 910 so that each image pickup module has the lens of the optical element set 964 bonded to the semiconductor wafer 910.

The shape of the optical element set is not limited only to the cross shape or rectangular shape, but it may be a T-character shape, an I-character shape, an L-character shape or the like.

Figure 15:
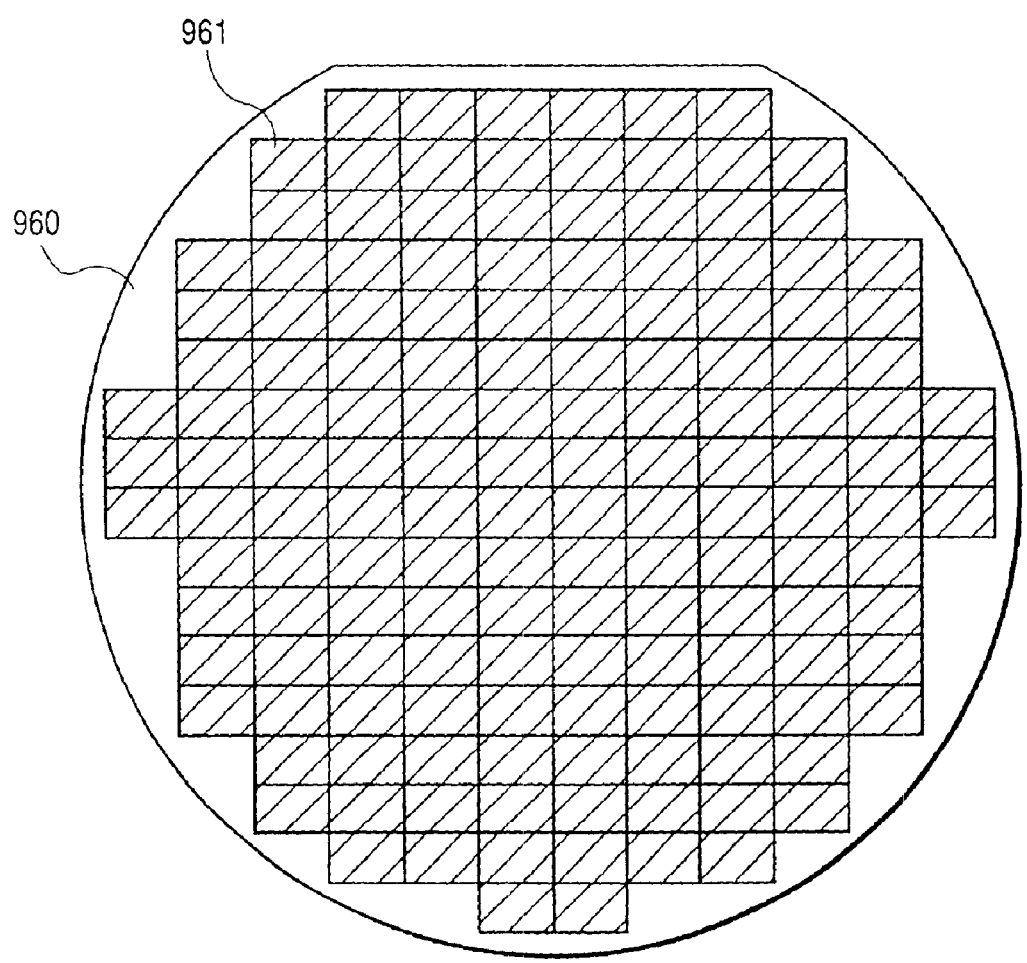
FIG. 15 is a schematic plan view of a semiconductor wafer with semiconductor chips.
Figure 16:
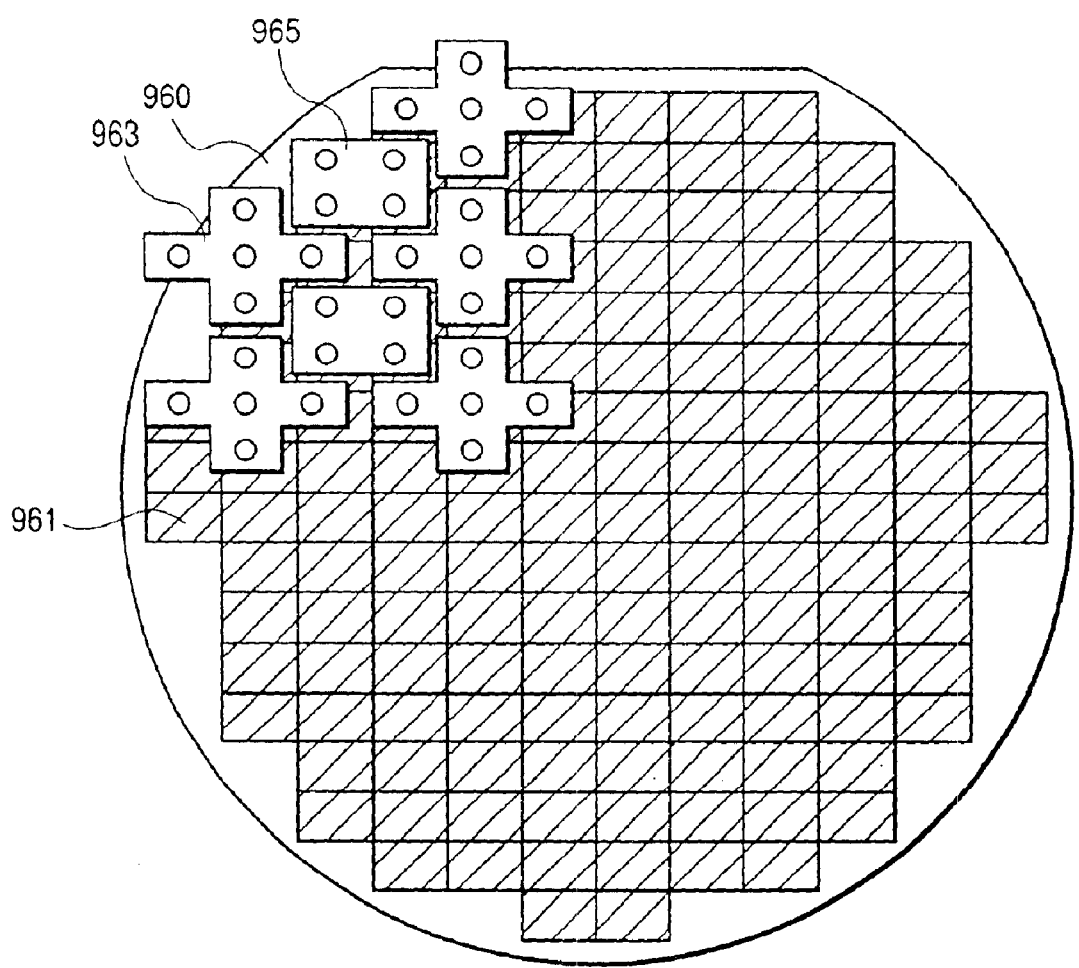
FIG. 16 is a schematic plan view of the semiconductor wafer shown in FIG. 15 to which the optical element sets shown in FIGS. 13 and 14 are bonded.
Figure 17:
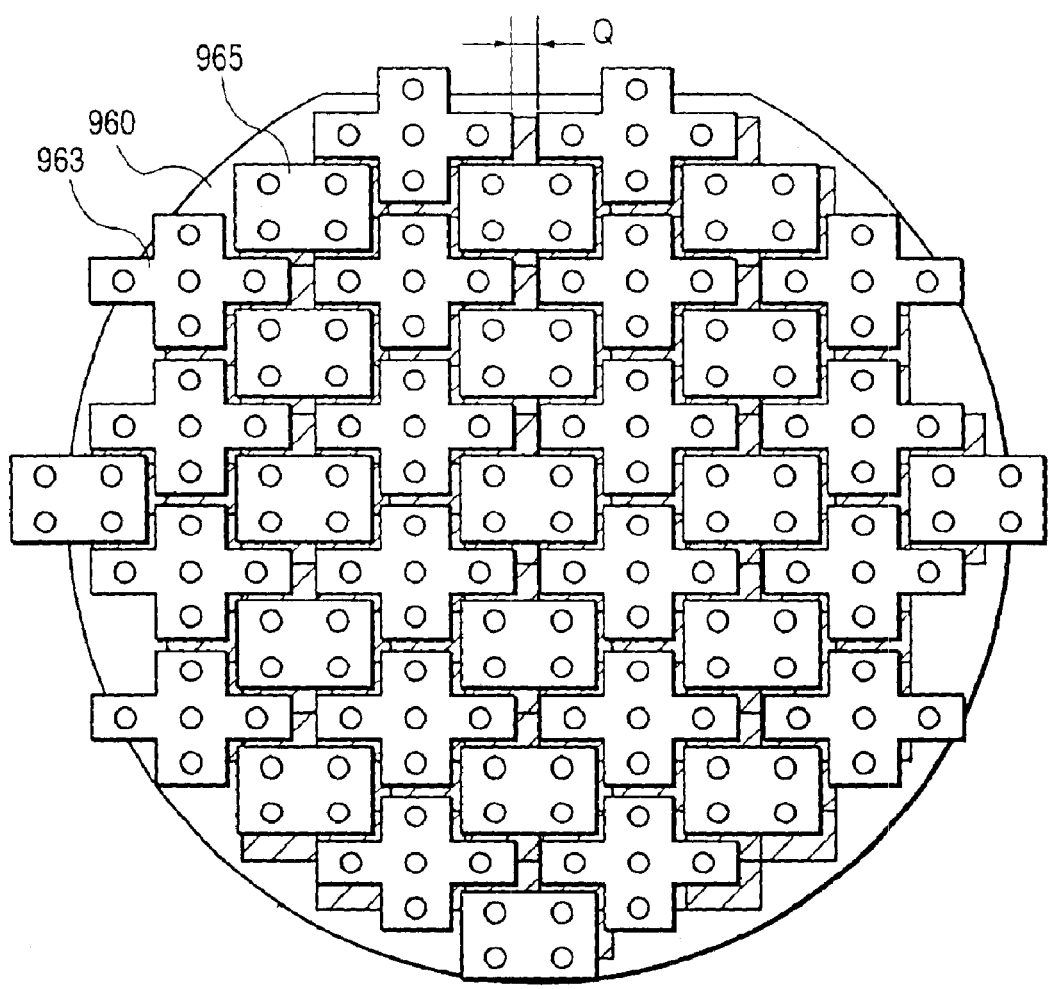
FIG. 17 is a schematic plan view of the semiconductor wafer on the whole surface of which the optical element sets are mounted.
Figure 18A:
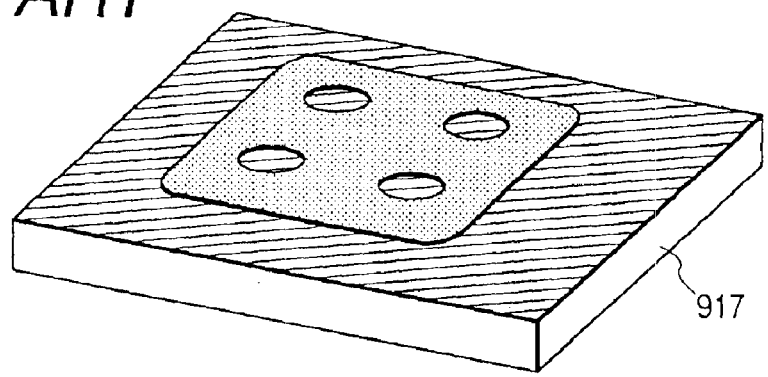
FIGS. 18A, 18B, and 18C are broken perspective views illustrating a conventional image pickup module manufacture processes.
Figure 18B:
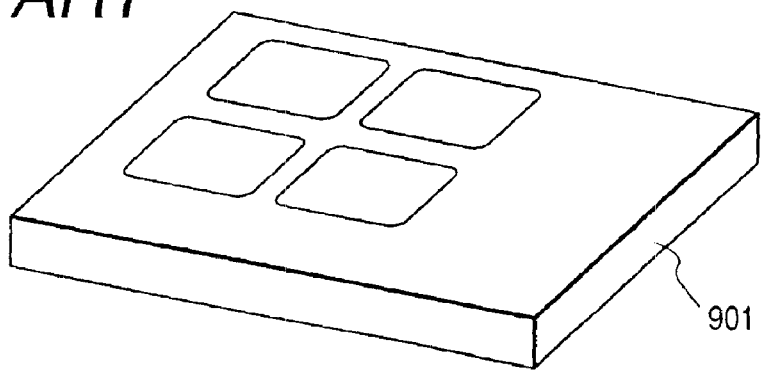
Figure 18C:
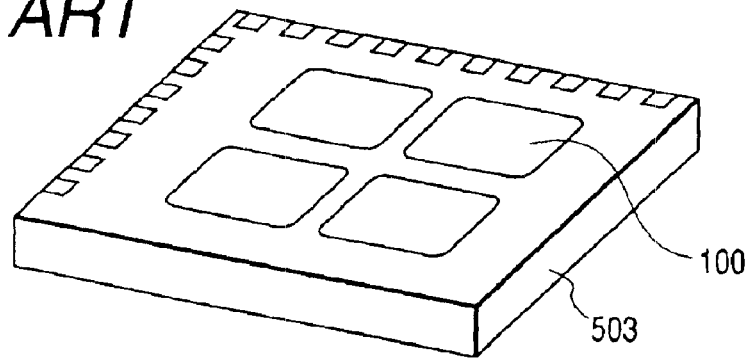
Figure 19A:
FIGS. 19A to 19C are schematic cross sectional views illustrating another conventional image pickup module manufacture processes.
Figure 19B:
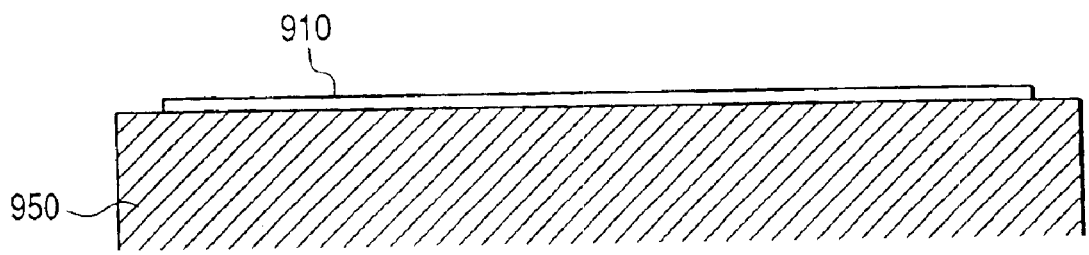
Figure 19C:
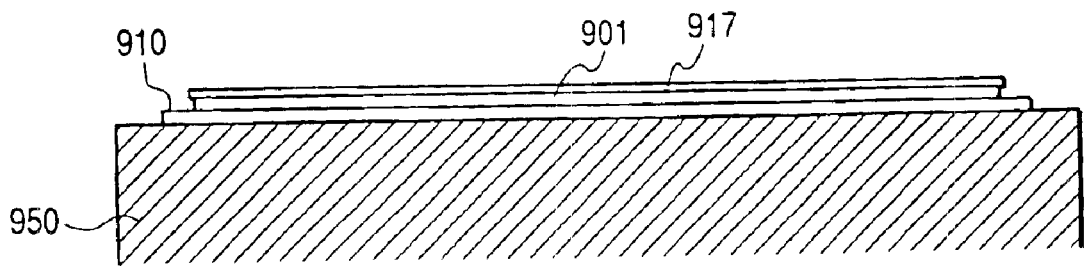

With reference to FIGS. 15 to 17, the semiconductor device manufacture processes according to the embodiment will be described in more detail.

FIG. 15 is a schematic plan view of a semiconductor wafer with semiconductor chips. In FIG. 15, reference numeral 960 represents a semiconductor wafer, and reference numeral 961 represents a semiconductor chip.

FIG. 16 is a schematic plan view of the semiconductor wafer shown in FIG. 15 to which the optical element sets shown in FIGS. 13 and 14 are bonded.

FIG. 17 is a schematic plan view of the semiconductor wafer on the whole surface of which the optical element sets are mounted.

Normally, the semiconductor wafer 960 is formed with as many semiconductor chips 961 as possible as shown in FIG. 15. However, as described with reference to FIG. 7 and the like, if the optical element set 917 and spacer 901 are bonded to two semiconductor chips 503, some semiconductor chips 961 cannot be used in some cases. These semiconductor chips 961 are those formed in the peripheral area of the semiconductor wafer 960 excepting the area near the orientation flat.

In order to avoid this, as shown in FIG. 16, the optical element sets 963 are disposed in a zigzag manner and bonded to the semiconductor wafer in such a manner that the corners of the optical element sets 965 are aligned with the convex corners of the optical element sets 963. As shown in FIG. 17, the optical element sets 965 and 963 are disposed on all semiconductor chips 961 on the semiconductor wafer 960. The gap Q is formed between adjacent optical element sets 963 along their longitudinal direction by considering the warp of the semiconductor wafer 960. In this embodiment, for the purposes of description simplicity, the optical element sets 963 and 965 shown in FIGS. 13 and 14 are used. However, as shown in FIG. 17, some optical element sets 963 and 965 cannot be used. To avoid this, in a practical case, optical element sets having the shapes in conformity with those of the semiconductor chips 961 formed on the semiconductor wafer 960 are used to manufacture image pickup modules.

As described so far, according to the invention, a semiconductor manufacture method is provided which can make a semiconductor substrate and an opposing substrate be difficult to be peeled off even if the semiconductor substrate tends to recover the original warp when it is dismounted from a jig (base).

What is claimed is:

1. A semiconductor device manufacture method comprising:
   a step of bonding a first substrate and a second substrate having a light reception element by using a spacer; and
   a step of cutting the first and second substrates,
   wherein said cutting step cuts the first substrate at a position where the spacer is disposed under the first substrate, and
   wherein an electrode pad is disposed on at least one side of the second substrate, and the spacer is disposed on the same side of the second substrate on which the electrode pad is disposed, such that after said cutting step is effected, the spacer is disposed inwards of the electrode pad.

2. A semiconductor device manufacture method according to claim 1, wherein the first substrate is formed with a plurality of lenses.

3. A semiconductor device manufacture method comprising:
   a step of holding the semiconductor substrate on a base under a condition that a warp of the semiconductor substrate is removed;
   a step of bonding an opposing substrate to the semiconductor substrate with a size of the opposing substrate being adjusted according to the warp of the semiconductor substrate; and then
   a step of cutting the opposing substrate,
   wherein the semiconductor substrate is formed with a light reception element or light reception elements, and the opposing substrate is formed with an optical element or optical elements, with the optical element or optical elements being set for converging light on the light reception element or light reception elements.

4. A semiconductor device manufacture method according to claim 3, comprising a step of bonding a plurality of opposing substrates to the semiconductor substrate with a gap between said plurality of opposing substrates corresponding to the size of the warp of the semiconductor substrate.

5. A semiconductor device manufacture method according to claim 3, wherein said step of bonding the opposing substrate to the semiconductor substrate uses a spacer disposed between the opposing substrate and the semiconductor substrate.

6. A semiconductor device manufacture method according to claim 3, wherein said step of cutting the opposing substrate cuts an area of the opposing substrate where a spacer is disposed under the opposing substrate.

7. A semiconductor device manufacture method according to claim 3, wherein the opposing substrate is formed with a compound eye element having a plurality of lenses.

8. A semiconductor device manufacture method according to claim 3, wherein the semiconductor substrate is a semiconductor wafer.

9. A semiconductor device manufacture method according to claim 3, wherein the opposing substrate has a rectangular shape, a cross shape, a T-character shape, an I-character shape, an L-character shape or a polygonal shape.

* * * * *